(12) United States Patent
Sundaresan et al.

(10) Patent No.: US 6,300,177 B1
(45) Date of Patent: Oct. 9, 2001

(54) METHOD TO FORM TRANSISTORS WITH MULTIPLE THRESHOLD VOLTAGES ($V_T$) USING A COMBINATION OF DIFFERENT WORK FUNCTION GATE MATERIALS

(75) Inventors: Ravi Sundaresan, San Jose, CA (US); Yang Pan; James Yong Meng Lee, both of Singapore (SG); Ying Keung Leung, Aberdeen (HK); Yelehanka Ramachandramurthy Pradeep; Jia Zhen Zheng, both of Singapore (SG); Lap Chan, San Francisco, CA (US); Elgin Quek, Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/768,488

(22) Filed: Jan. 25, 2001

(51) Int. Cl.[7] .................. H01L 21/336; H01L 21/4763
(52) U.S. Cl. .................... 438/197; 438/585; 438/586; 438/595; 438/596
(58) Field of Search .................... 438/197, 585, 438/586, 595, 596, 283, 267, 289; 257/288, 407, 763, 408

(56) References Cited

U.S. PATENT DOCUMENTS

| | | |
|---|---|---|
| 5,356,833 * | 10/1994 | Maniar et al. ............... 437/187 |
| 5,447,874 | 9/1995 | Grivna et al. ............... 437/40 |
| 5,686,329 * | 11/1997 | Chang et al. ............... 437/41 |
| 5,719,068 * | 2/1998 | Suzawa et al. ............... 437/44 |
| 5,776,823 | 7/1998 | Agnello et al. ............... 438/592 |
| 5,912,492 * | 6/1999 | Chang et al. ............... 257/344 |
| 5,920,076 * | 7/1999 | Burgin et al. ............... 250/492.1 |
| 5,960,270 | 9/1999 | Misra et al. ............... 438/197 |
| 5,965,911 | 10/1999 | Joo et al. ............... 257/288 |
| 5,966,597 | 10/1999 | Wright ............... 438/197 |
| 6,051,470 | 4/2000 | An et al. ............... 438/283 |

* cited by examiner

Primary Examiner—Michael S. Lebentritt
(74) Attorney, Agent, or Firm—George O. Saile; Rosemary L. S. Pike; Stephen G. Stanton

(57) ABSTRACT

A method of forming a gate electrode, comprising the following steps. A semiconductor substrate having an overlying patterned layer exposing a portion of the substrate within active area and patterned layer opening. The patterned layer having exposed sidewalls. Internal spacers are formed over a portion of the exposed substrate portion within the patterned layer opening on the patterned layer exposed sidewalls. The internal spacers being comprised of a WF1 material having a first work function. A planarized gate electrode body is formed within the remaining portion of the patterned layer opening and adjacent to the internal spacers. The gate electrode body being comprised of a WF2 material having a second work function. The internal spacers and the gate electrode body forming the gate electrode.

26 Claims, 2 Drawing Sheets

METHOD TO FORM TRANSISTORS WITH MULTIPLE THRESHOLD VOLTAGES ($V_T$) USING A COMBINATION OF DIFFERENT WORK FUNCTION GATE MATERIALS

FIELD OF THE INVENTION

The present invention relates generally to forming integrated circuit transistors, and more specifically to a method of forming integrated circuit transistor gates that control short channel effects.

BACKGROUND OF THE INVENTION

Deep submicron transistors require special implants, for example pocket implants, to control short channel effects.

U.S. Pat. No. 5,960,270 to Misra et al. describes a gate with SiN spacers 23 and a WF1 gate, for example metal.

U.S. Pat. No. 5,447,874 to Grivna et al. describes a dual metal gate.

U.S. Pat. No. 5,776,823 to Agnello et al. describes a multi-level (WF) gate.

U.S. Pat. No. 5,966,597 to Wright and U.S. Pat. No. 5,965,911 to Joo et al. describes describe dual material gates.

U.S. Pat. No. 6,051,470 to An et al. describes a dual-gate electrode having edge conductive portions, a central conductive portion, and dielectric sidewall spacers formed between the edge conductive portions and the central conductive portion.

SUMMARY OF THE INVENTION

Accordingly, it is an object of the present invention to provide a method of fabricating a gate with multiple threshold voltages ($V_T$).

Another object of the present invention to provide a method of fabricating a gate with multiple threshold voltages by using a combination of different work function gate materials while avoiding special implants.

Other objects will appear hereinafter.

It has now been discovered that the above and other objects of the present invention may be accomplished in the following manner. Specifically, a semiconductor substrate having an overlying patterned layer exposing a portion of the substrate within active area and patterned layer opening. The patterned layer having exposed sidewalls. Internal spacers are formed over a portion of the exposed substrate portion within the patterned layer opening on the patterned layer exposed sidewalls. The internal spacers being comprised of a WF1 material having a first work function. A planarized gate electrode body is formed within the remaining portion of the patterned layer opening and adjacent to the internal spacers. The gate electrode body being comprised of a WF2 material having a second work function. The internal spacers and the gate electrode body forming the gate electrode.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Starting Structure

Figure 1:
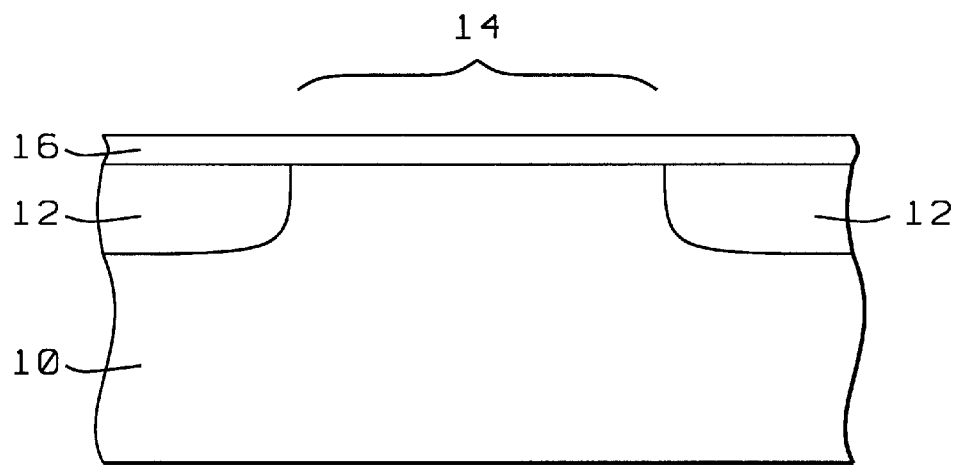
FIGS. 1 to 4 schematically illustrate in cross-sectional representation a preferred embodiment of the present invention.

Accordingly as shown in FIG. 1, starting semiconductor substrate 10 may be a silicon substrate. Well and punch through implants (not shown) are performed using N-well and P-well masks as appropriate.

Shallow trench isolations (STIs) 12 are formed within silicon substrate 10 and define active area 14 therebetween.

Sacrificial oxide layer 16 is formed over silicon substrate 10 and STIs 12. Sacrificial oxide layer 16 is preferably from about 100 to 300 Å thick.

Formation of Patterned Layer

Figure 2:
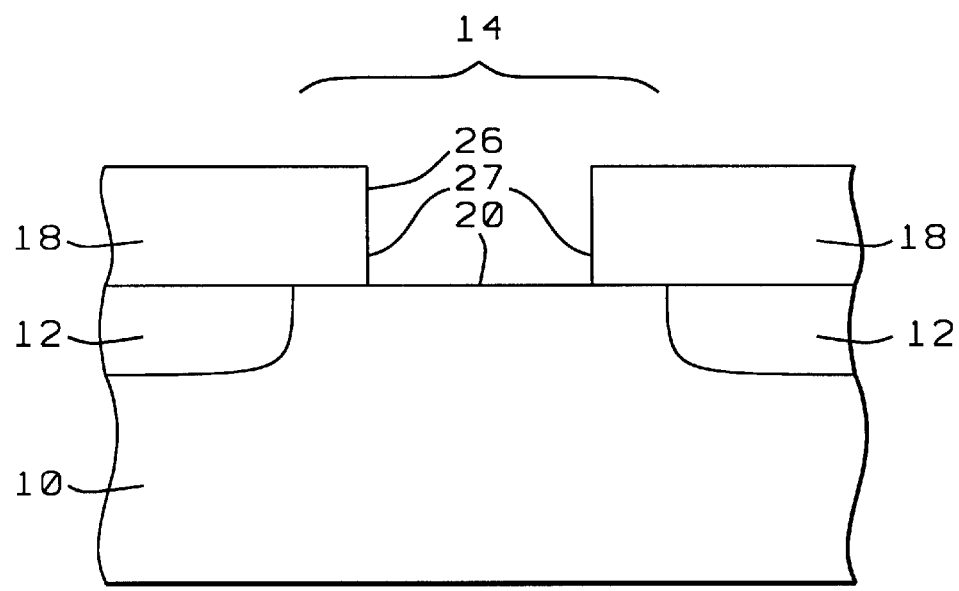

As shown in FIG. 2, sacrificial oxide layer 16 is removed.

Patterned layer 18 is formed over silicon substrate 10 and STIs 12 to thickness of preferably from about 1000 to 3000 Å. Patterned layer 18 is preferably formed of silicon oxide ($SiO_2$) or silicon nitride ($Si_3N_4$), and is more preferably formed of silicon nitride (nitride).

Patterned nitride layer 18 has opening 26 which exposes a portion 20 of silicon substrate 10 within active area 14. Patterned nitride layer 18 also has exposed sidewalls 27 within opening 26.

Formation of Gate Oxide Layer

Figure 3:
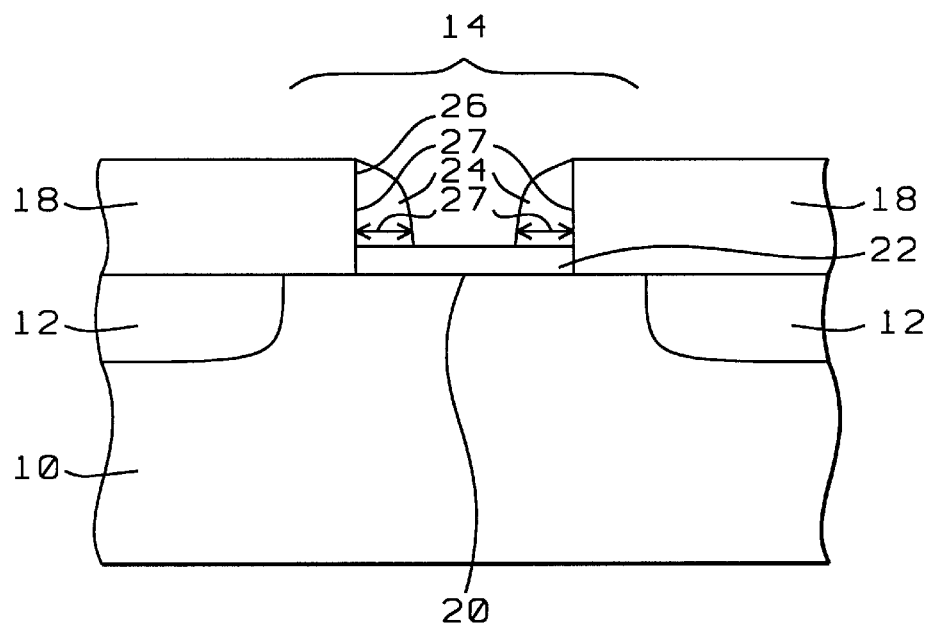

As shown in FIG. 3, layer of gate oxide 22 is formed over portion 20 of silicon substrate 10 within, opening 26. Gate oxide 22 is preferably from about 10 to 50 Å thick, and is more preferably from about 15 to 25 Å thick.

Formation of WF1 Internal Spacers

As shown in FIG. 3, a WF1 material layer having a first work function is deposited within patterned nitride layer opening 26, and is etched to form WF1 internal spacers 24 on the exposed sidewalls 27 of patterned nitride layer 18. WF1 internal spacers 24 have a base width 27 of preferably from about 200 to 1200 Å, and more preferably from about 200 to 400 Å.

Formation of WF2 Gate Electrode Body

Figure 4:
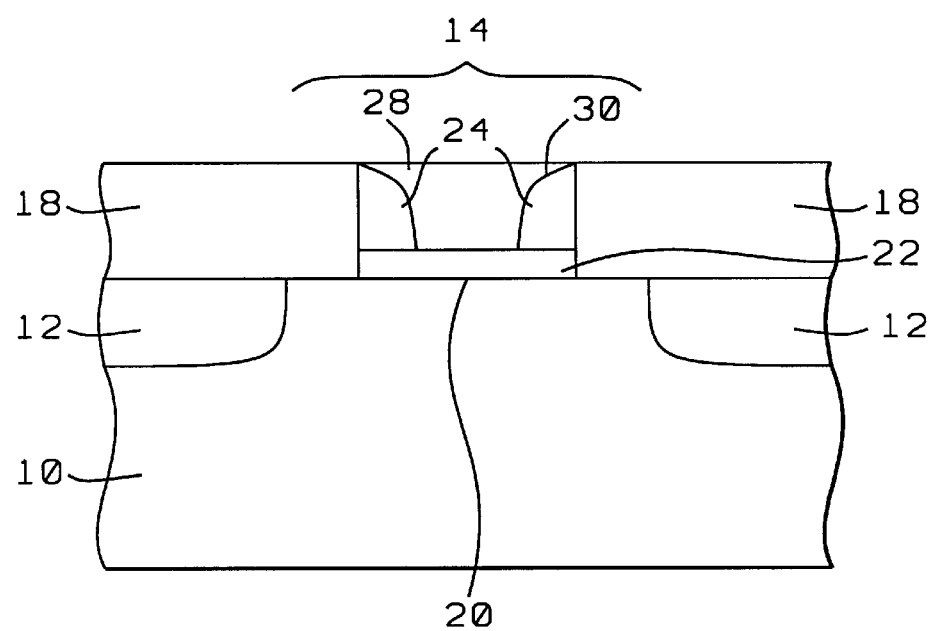

As shown in FIG. 4, WF2 material having a second work function is deposited within patterned nitride layer opening 26 adjacent to WF1 internal spacers 24, and is then planarized (preferably by chemical mechanical polishing (CMP)) to form WF2 gate electrode body 28. Work function is a common semiconductor physics term. It is the energy required to bring an electron at the Fermi level of a material to the vacuum or free energy, level.

Planarized WF2 gate electrode body 28 is preferably from about 1000 to 3000 Å thick, and is more preferably from about 1500 to 2500 Å thick.

WF1 internal spacers 24 and WF2 gate electrode body 28 together comprise gate electrode 30.

Composition of WF1 Internal Spacers 24 and WF2 Gate Electrode Body

The following Table I illustrates the preferred WF1/WF2 material combinations for the WF1 internal spacers 24 and the WF2 gate electrode body 28 forming gate electrode 30 for a PMOS and NMOS device. Table I illustrates a combination of preferred WF1/WF2 materials comprising gate electrode 30 with the more preferred ("mp") materials so indicated. Any PMOS WF1 material from the PMOS WF1 column may be selected and combined with any PMOS WF2 material selected from the PMOS WF2 column; and any NMOS WF1 material from the NMOS WF1 column may be selected and combined with any NMOS WF2 material selected from the NMOS WF2 column.

TABLE I

| PMOS | | NMOS | |
|---|---|---|---|
| WF1 | WF2 | WF1 | WF2 |
| W | TaN | W | $RuO_2$ |
| Co | Ti | Co | Pt |
| Ni | Ta | Ni | |
| $TiSi_2$ | Mo | $TiSi_2$ | |
| $WSi_x$ | Al | $WSi_x$ | |
| $NiSi_x$ | | $NiSi_x$ | |
| $CoSi_x$ | | $CoSi_x$ | |
| WN | | WN | |
| $TiN_x$ | | $TiN_x$ | |

Conventional techniques may then be used to form semiconductor transistors incorporating the gate electrode 30 fabricated in accordance with the present invention.

Gate electrodes 30 control short channel effects without the necessity of having to form special implants such as pocket implants because the different work function near the edge will give a higher local $V_T$.

The advantages of the present invention include:
1. its compatibility with advanced metal gate processes; and
2. it is a simpler process without pocket implants.

While particular embodiments of the present invention have been illustrated and described, it is not intended to limit the invention, except as defined by the following claims.

We claim:

1. A method of forming a gate electrode, comprising the steps of:
   a) providing a semiconductor substrate having an overlying patterned layer exposing a portion of said substrate within active area and patterned layer opening; said patterned layer having exposed sidewalls;
   b) forming internal spacers over a portion of said exposed substrate portion within said patterned layer opening on said patterned layer exposed sidewalls; said internal spacers being comprised of a WF1 material having a first work function; and
   c) forming a planarized gate electrode body within the remaining portion of said patterned layer opening and adjacent to said internal spacers; said gate electrode body being comprised of a WF2 material having a second work function;
said internal spacers and said gate electrode body forming said gate electrode.

2. The method of claim 1, wherein said substrate includes STIs defining said active area.

3. The method of claim 1, wherein said patterned layer is comprised of a layer selected from the group consisting of silicon oxide and silicon nitride; said WF1 material is selected from the PMOS WF1 column of Table I; and said WF2 material is selected from the PMOS WF2 column of Table I.

4. The method of claim 1, wherein said patterned layer is comprised of a layer selected from the group consisting of silicon oxide and silicon nitride; said WF1 material is selected from the NMOS WF1 column of Table I; and said WF2 material is selected from the NMOS WF2 column of Table I.

5. The method of claim 1, wherein said patterned layer is comprised of a layer selected from the group consisting of silicon oxide and silicon nitride; said WF1 material is selected from the PMOS WF1 column of Table I; and said WF2 material is selected from the PMOS WF2 column of Table I.

6. The method of claim 1, wherein said patterned layer is comprised of silicon nitride; said WF1 material is $TiN_x$; and said WF2 material is TaN.

7. The method of claim 1, wherein said patterned layer is comprised of silicon nitride; said WF1 material is $TiSi_2$; and said WF2 material is $RuO_2$.

8. The method of claim 1, including the step of forming a gate oxide layer over said exposed portion of substrate within patterned layer opening before said internal spacer formation step; said gate oxide layer having a thickness of from about 10 to 50 Å.

9. The method of claim 1, wherein said patterned layer is from about 1000 to 3000 Å thick and is comprised of silicon nitride; said internal spacers have a base width of from about 200 to 1200 Å; and said gate electrode body is from about 1000 to 3000 Å thick.

10. The method of claim 1, wherein said patterned layer is from about 1000 to 3000 Å thick and is comprised of silicon nitride; said internal spacers have a base width of from about 200 to 400 Å; and said gate electrode body is from about 1500 to 2500 Å thick.

11. A method of forming a gate electrode, comprising the steps of:
   a) providing a semiconductor substrate having an overlying patterned layer exposing a portion of said substrate within active area and patterned layer opening; said patterned layer having exposed sidewalls;
   b) forming a gate oxide layer upon said substrate exposed portion;
   c) forming internal spacers over a portion of said gate oxide layer within said patterned layer opening on said patterned layer exposed sidewalls; said internal spacers being comprised of a WF1 material having a first work function; and
   d) forming a planarized gate electrode body within the remaining portion of said patterned layer opening upon said gate oxide layer and adjacent to said internal spacers; said gate electrode body being comprised of a WF2 material having a second work function;
said internal spacers and said gate electrode body forming said gate electrode.

12. The method of claim 11, wherein said substrate includes STIs defining said active area.

13. The method of claim 11, wherein said patterned layer is comprised of a layer selected from the group consisting of silicon oxide and silicon nitride; said WF1 material is selected from the PMOS WF1 column of Table I; and said WF2 material is selected from the PMOS WF2 column of Table I.

14. The method of claim 11, wherein said patterned layer is comprised of a layer selected from the group consisting of silicon oxide and silicon nitride; said WF1 material is selected from the NMOS WF1 column of Table I; and said WF2 material is selected from the NMOS WF2 column of Table I.

15. The method of claim 11, wherein said patterned layer is comprised of silicon nitride; said WF1 material is $TiN_x$; and said WF2 material is TaN.

16. The method of claim 11, wherein said patterned layer is comprised of silicon nitride; said WF1 material is $TiSi_2$; and said WF2 material is $RuO_2$.

17. The method of claim 11, wherein said gate oxide layer is from about 10 to 50 Å thick; said patterned layer is from about 1000 to 3000 Å thick and is comprised of silicon nitride; said internal spacers have a base width of from about 200 to 1200 Å; and said gate electrode body is from about 1000 to 3000 Å thick.

18. The method of claim 11, wherein said gate oxide layer is from about 15 to 25 Å thick; said patterned layer is from about 1000 to 3000 Å thick and is comprised of silicon nitride; said internal spacers have a base width of from about 200 to 400 Å and said gate electrode body is from about 1500 to 2500 Å thick.

19. A method of forming a gate electrode, comprising the steps of:
   a) providing a semiconductor substrate having an overlying patterned layer exposing a portion of said substrate within active area and patterned layer opening said patterned layer having exposed sidewalls; said substrate includes STIs defining said active area;
   b) forming a gate oxide layer upon said substrate exposed portion;
   c) forming internal spacers over a portion of said gate oxide layer within said patterned layer opening on said patterned layer exposed sidewalls; said internal spacers being comprised of a WF1 material having a first work function; and
   d) forming a planarized gate electrode body within the remaining portion of said patterned layer opening upon said gate oxide layer and adjacent to said internal spacers; said gate electrode body being comprised of a WF2 material having a second work function;
said internal spacers and said gate electrode body forming said gate electrode.

20. The method of claim 19, wherein said patterned layer is comprised of a layer selected from the group consisting of silicon oxide and silicon nitride; said WF1 material is selected from the PMOS WF1 column of Table I; and said WF2 material is selected from the PMOS WF2 column of Table I.

21. The method of claim 19, wherein said patterned layer is comprised of a layer selected from the group consisting of silicon oxide and silicon nitride; said WF1 material is selected from the NMOS WF1 column of Table I; and said WF2 material is selected from the NMOS WF2 column of Table I.

22. The method of claim 19, wherein said patterned layer is comprised of a layer selected from the group consisting of silicon oxide and silicon nitride; said WF1 material is selected from the PMOS WF1 column of Table I; and said WF2 material is selected from the PMOS WF2 column of Table I.

23. The method of claim 19, wherein said patterned layer is comprised of silicon nitride; said WF1 material is $TiN_x$; and said WF2 material is TaN.

24. The method of claim 19, wherein said patterned layer is comprised of silicon nitride; said WF1 material is $TiSi_x$; and said WF2 material is $RuO_2$.

25. The method of claim 19, wherein said gate oxide layer is from about 10 to 50 Å thick; said patterned layer is from about 1000 to 3000 Å thick and is comprised of silicon nitride; said internal spacers have a base width of from about 200 to 1200 Å; and said gate electrode body is from about 1000 to 3000 Å thick.

26. The method of claim 19, wherein said gate oxide layer is from about 15 to 25 Å thick; said patterned layer is from about 1000 to 3000 Å thick and is comprised of silicon nitride; said internal spacers have a base width of from about 200 to 400 Å; and said gate electrode body is from about 1500 to 2500 Å thick.

* * * * *

UNITED STATES PATENT AND TRADEMARK OFFICE
CERTIFICATE OF CORRECTION

PATENT NO. : 6,300,177 B1  Page 1 of 1
DATED : October 9, 2001
INVENTOR(S) : Ravi Sundaresan, Yang Pan, James Yong Meng Lee, Ying Keung Leung, Yelehanka Ramachandramurthy Pradeep, Lap Chan, Elgin Quek It is certified that error appears in the above-identified patent and that said Letters Patent is hereby corrected as shown below:

<u>Title page,</u>
Item [75], delete, "Aberdeen" and replace with -- Hong Kong --.

Signed and Sealed this

Twenty-sixth Day of March, 2002

*Attest:*

*Attesting Officer*

JAMES E. ROGAN
*Director of the United States Patent and Trademark Office*